United States Patent
Nakata et al.

(10) Patent No.: US 8,681,327 B2
(45) Date of Patent: Mar. 25, 2014

(54) FAULT DETECTION METHOD AND FAULT DETECTION APPARATUS FOR VCSEL

(75) Inventors: Atsushi Nakata, Yokosuka (JP); Chiemi Yamagata, Susono (JP); Satoshi Tanaka, Yokosuka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/505,611

(22) PCT Filed: Nov. 2, 2010

(86) PCT No.: PCT/JP2010/069520
§ 371 (c)(1),
(2), (4) Date: Jun. 13, 2012

(87) PCT Pub. No.: WO2011/052785
PCT Pub. Date: May 5, 2011

(65) Prior Publication Data
US 2012/0242990 A1 Sep. 27, 2012

(30) Foreign Application Priority Data
Nov. 2, 2009 (JP) ................................. 2009-251731

(51) Int. Cl.
*G01J 1/00* (2006.01)
*G01J 1/42* (2006.01)

(52) U.S. Cl.
CPC ...................................... *G01J 1/4257* (2013.01)
USPC ............ 356/213; 356/218; 356/229; 356/230

(58) Field of Classification Search
CPC .................................. G01N 21/00; G01J 1/4257
USPC ............ 356/237.1–237.5, 213, 218, 229, 230
See application file for complete search history.

(56) References Cited

U.S. PATENT DOCUMENTS

| 5,116,767 A | 5/1992 | DeChiaro et al. |
| 7,295,590 B2 | 11/2007 | Crews |
| 2008/0129983 A1* | 6/2008 | Mathes et al. ............... 356/73.1 |
| 2009/0196600 A1 | 8/2009 | Sakamoto et al. |

FOREIGN PATENT DOCUMENTS

| JP | 11-150325 A | 6/1999 |
| JP | 2005-123289 A | 5/2005 |
| JP | 2006-303365 A | 11/2006 |
| JP | 2007-35923 A | 2/2007 |

(Continued)

OTHER PUBLICATIONS

International Search Report (PCT/ISA/210) issued by the International Searching Authority in corresponding International Application No. PCT/JP2010/069520 on Dec. 7, 2010.

(Continued)

*Primary Examiner* — Michael P Stafira
(74) *Attorney, Agent, or Firm* — Sughrue Mion, PLLC

(57) ABSTRACT

Proposed is a technique for detecting a damaged VCSEL in a short time and at low cost. It shows the light emission spectrum of a multi-mode VCSEL before an ESD damage, and the light emission spectrum which shows several peaks corresponding to the structure of the active layer (MQW) and the upper and lower reflectors (DBR) is obtained. On the other hand, when the VCSEL which has an ESD damage has a damage in the active layer, the light emission spectrum which shows fewer peaks than the original number of peaks is obtained. Accordingly, the light spectrum analyzer analyzes the light emission spectrum, and it is determined that ESD damage has occurred when the number of peaks is equal to or smaller than a predetermined number, e.g., two peaks.

3 Claims, 3 Drawing Sheets

(56) References Cited

FOREIGN PATENT DOCUMENTS

| | | |
|---|---|---|
| JP | 2007-129011 A | 5/2007 |
| JP | 2008-520113 A | 6/2008 |
| JP | 2009-187995 A | 8/2009 |

OTHER PUBLICATIONS

Written Opinion (PCT/ISA/237) of the International Searching Authority issued in corresponding International Application No. PCT/JP2010/069520 on Dec. 7, 2010.

* cited by examiner

FAULT DETECTION METHOD AND FAULT DETECTION APPARATUS FOR VCSEL

TECHNICAL FIELD

The present invention relates to a fault detection method and a fault detection apparatus for VCSEL.

BACKGROUND ART

Of semiconductor lasers, there is a VCSEL (Vertical-Cavity Surface-Emitting Laser) which makes light to be resonated in a direction perpendicular to a substrate surface, and emitted in the direction perpendicular to the substrate surface, other than a type which makes light to be resonated in a direction parallel with the substrate surface, and emitted in the direction. The VCSEL has many advantages. For example, the power consumption of a system with the VCSEL is small, it is possible to perform high-speed modulation even when the current is low, and the temperature controller can be simplified since the variation of the characteristic in response to temperature change is small. The VCSEL is widely applicable in fields such as a light source of a Gigabit Ethernet (registered trademark) or a Fiber Channel, a laser printer, and an optical interconnect.

On the other hand, there are problems that the VCSEL may be damaged due to ESD (electrostatic discharge), and the fault that the electrooptical property of the VCSEL deteriorates tends to occur. Thus, various techniques of detecting the occurrence of the damage and the fault due to the ESD are proposed. For example, a technique is proposed in which a leak current when a VCSEL is reversely biased is tested as a means to determine whether the VCSEL is damaged due to the ESD.

CITATION LIST

Patent Literature

Patent Literature 1: JP-T-2008-520113

SUMMARY OF THE INVENTION

Technical Problem

Typically, it is determined whether a VCSEL is damaged due to the ESD by performing various electrooptical evaluations, such as the current/light emission power characteristic and the current/voltage characteristic as shown in FIG. 5, or the electroluminescence (EL) measurement as shown in FIG. 6. However, for the following reasons, there is a problem that makes difficult to detect a damaged VCSEL from these measurements.

(1) It is necessary to provide a plurality of devices for evaluations, such as a semiconductor parameter system, a light power meter, an infrared camera or a microscope.
(2) It requires much time for measurement from the attachment of a VCSEL to the devices to the end of the measurement.
(3) It is not possible to perform evaluations when a VCSEL is modularized by being sealed with a lens or a package.
(4) In the technique disclosed in Patent Literature 1, the leak current when a VCSEL is reversely biased is tested as a means to determine whether the VCSEL is damaged by the ESD, as above-mentioned. However, since applying a reverse bias to the VCSEL requires a voltage source, an ammeter, and an additional pad for wiring, there is a problem that the system becomes a large-scale system and the cost increases.

For these reasons, other techniques to detect an ESD damage in VCSEL are needed.

The present invention has been made in view of these situations, and can solve the above problems. An object of the invention is to provide a technique of detecting a damaged VCSEL in a short time and at a low cost.

Solution to Problem

One mode of the invention relates to a fault detection method for VCSEL.

A first aspect of the invention that relates to a fault detection method for VCSEL includes a step of obtaining an output light of the VCSEL, a step of specifying the number of peaks of light emission spectrum of the output light by analyzing the light emission spectrum, and a step of determining that a fault has occurred in the VCSEL when the number of peaks is smaller than a predetermined number.

A second aspect of the invention relates to that in the first aspect, the predetermined number is a number that corresponds to a structure of an active layer of the VCSEL and reflectors which are formed above and below the active layer.

Another mode of the invention relates to a fault detection apparatus for VCSEL.

A third aspect of the invention that relates to a fault detection apparatus for VCSEL configured to obtain an output light of a VCSEL as an object to be checked, specify the number of peaks of light emission spectrum of the output light by analyzing the light emission spectrum, and determine that a fault has occurred in the VCSEL when the number of peaks is smaller than a reference threshold which is the number of peaks of the VCSEL appeared when a fault has not occurred.

Advantageous Effects of the Invention

According to the fault detection method and the fault detection apparatus for VCSEL of the invention, the technique of detecting a damaged VCSEL in a short time and at a low cost can be proposed.

MODES FOR CARRYING OUT THE INVENTION

Hereinafter, modes for carrying out the invention (hereinafter referred to as "embodiments") are explained with reference to the figures. A technique is proposed in which when an ESD in a forward and reverse direction is applied to a VCSEL and the inside of the VCSEL is damaged, the damaged VCSEL can be detected just by measuring the light emission spectrum of the VCSEL without performing the various conventional electrooptical evaluations.

Figure 1:
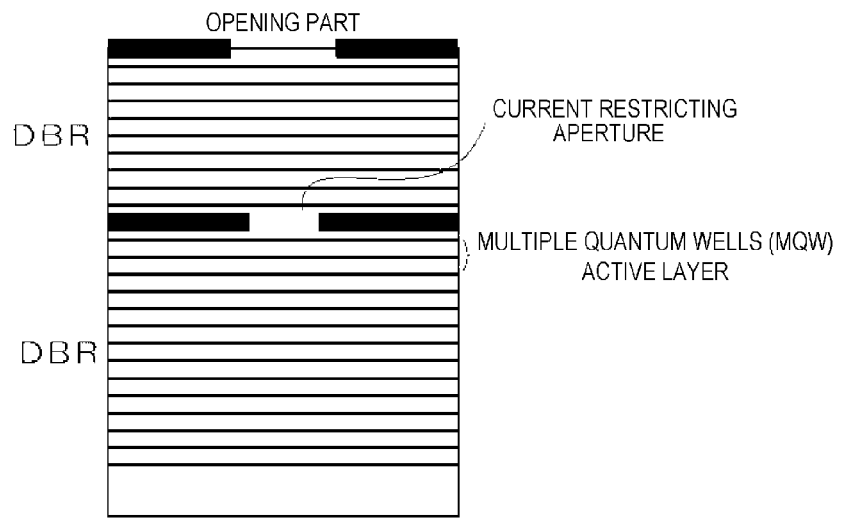
FIG. 1 is a diagram which shows a structure of a typical oxide type multi-mode VCSEL.
Figure 2:
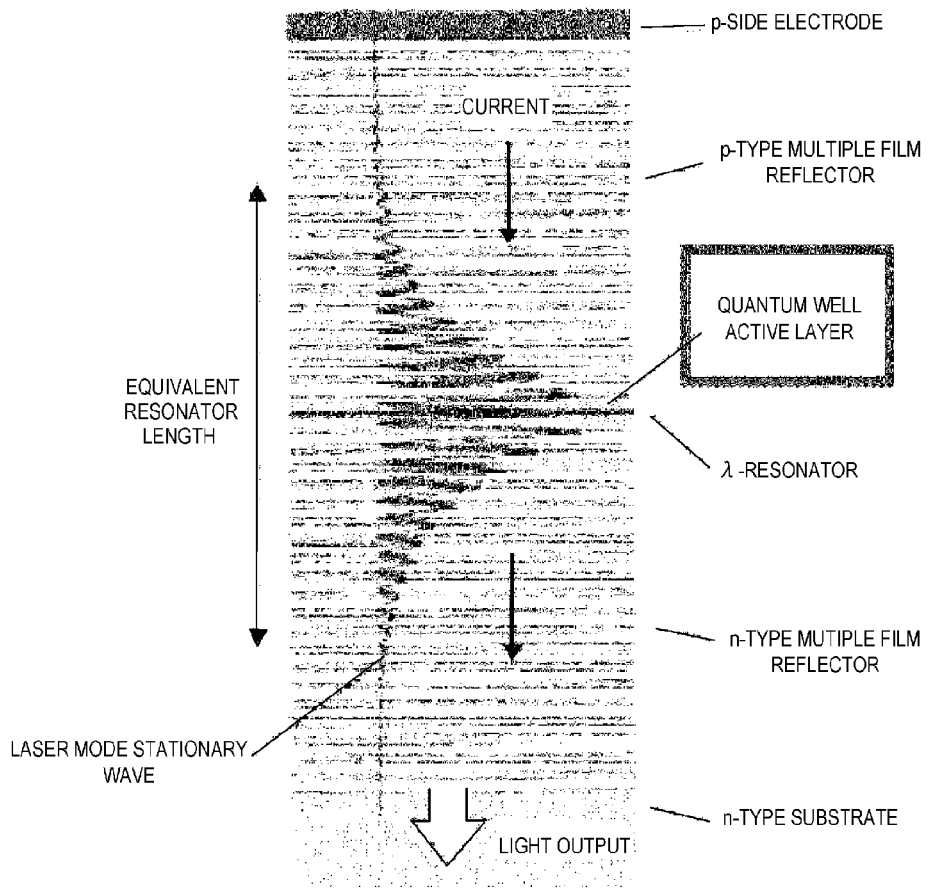
FIG. 2 is a conceptual diagram which shows a typical relation between an active layer and an oscillation spectrum.

A structure of a typical oxide type multi-mode VCSEL is shown in FIG. 1. The VCSEL has a selectively oxidized current restricting aperture on an active layer, and upper and lower semiconductor distributed Bragg reflectors (DBR) are arranged above the current restricting aperture and below the active layer. The active layer has a structure of multiple quantum wells (MQW). A conceptual diagram which shows a relation between the active layer and the oscillation spectrum is shown in FIG. 2. As shown in the figure, the MQW serves as an important portion which oscillates the light of center wavelengths in a side mode.

It is known that when an ESD is applied, the electrooptical property will become worse than before. As a result of performing various experiments, the knowledge is obtained that changes appear in the center wavelength and the side mode of the output light.

Figure 3:
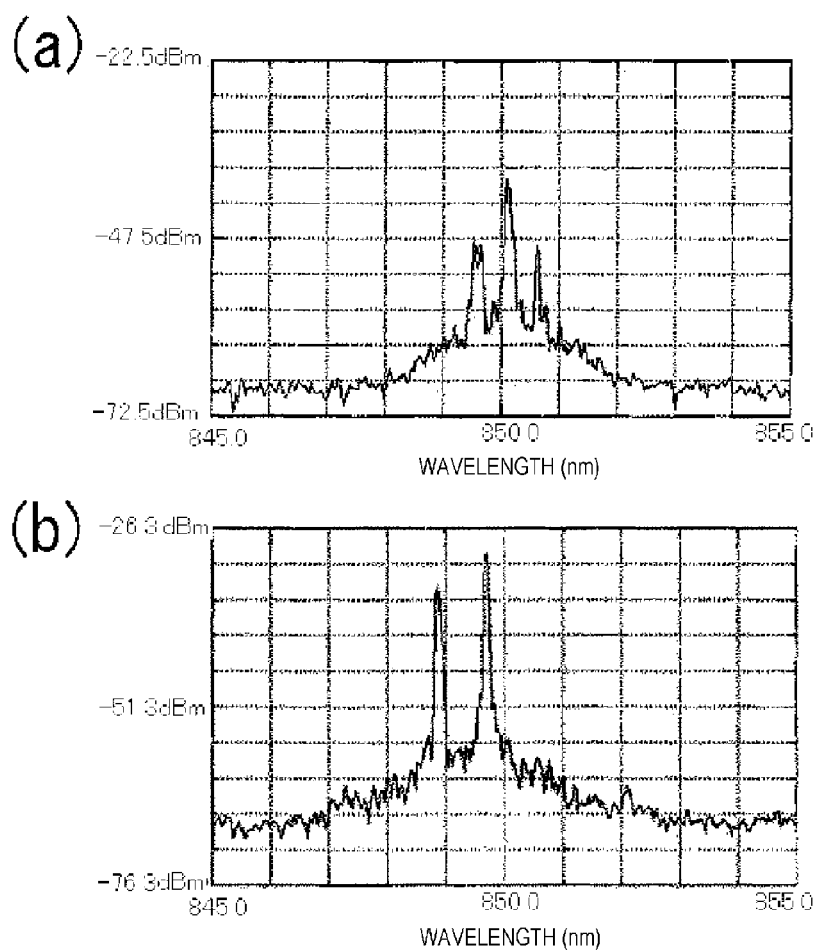
In FIG. 3, (a) and (b) are graphs which show light emission spectrums of the VCSEL, in which (a) of FIG. 3 shows the light emission spectrum of a VCSEL which has no ESD damage, and (b) in FIG. 3 shows the light emission spectrum of a VCSEL which has an ESD damage.

The light emission spectrums (which are also referred to as "oscillation spectrums") of a VCSEL which has no ESD damage and a VCSEL which has an ESD damage are shown in (a) and (b) of FIG. 3. In FIG. 3, (a) shows the light emission spectrum of a multi-mode VCSEL before an ESD damage, and the light emission spectrum which shows several peaks corresponding to the structure of the active layer (MQW) and the upper and lower reflectors (DBR) is obtained. In this case, there are three peaks. On the other hand, as shown in (b) in FIG. 3, when the VCSEL which has an ESD damage has a damage in the active layer, the light emission spectrum which shows fewer peaks than the original number of peaks is obtained. In this case, there are two peaks.

Figure 4:
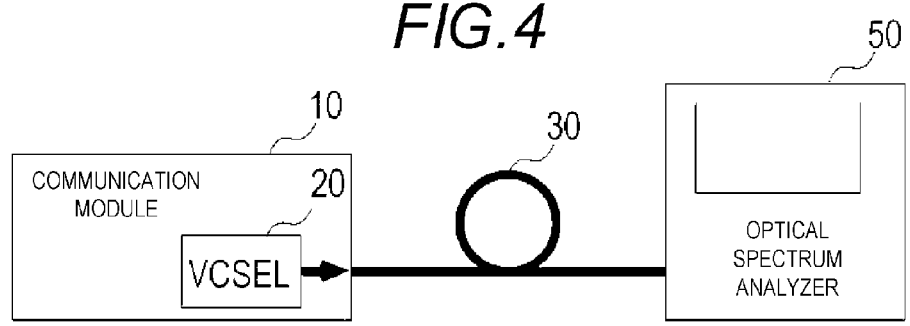
FIG. 4 is a diagram which shows a system that detects an ESD damage according to an embodiment of the invention.
Figure 5:
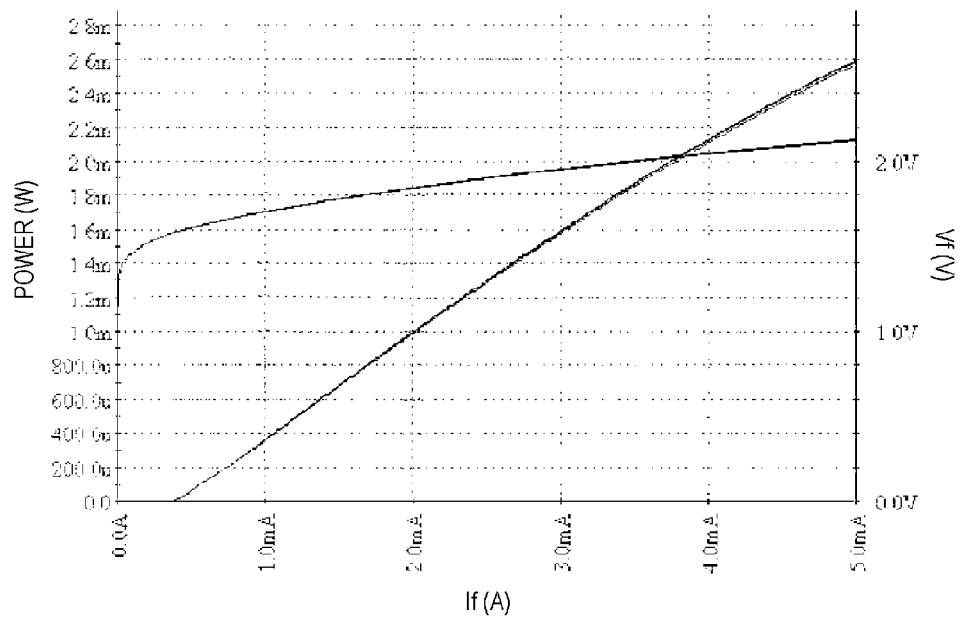
FIG. 5 is a graph which shows a typical light emission power characteristic of a VCSEL according to a conventional technique.
Figure 6:
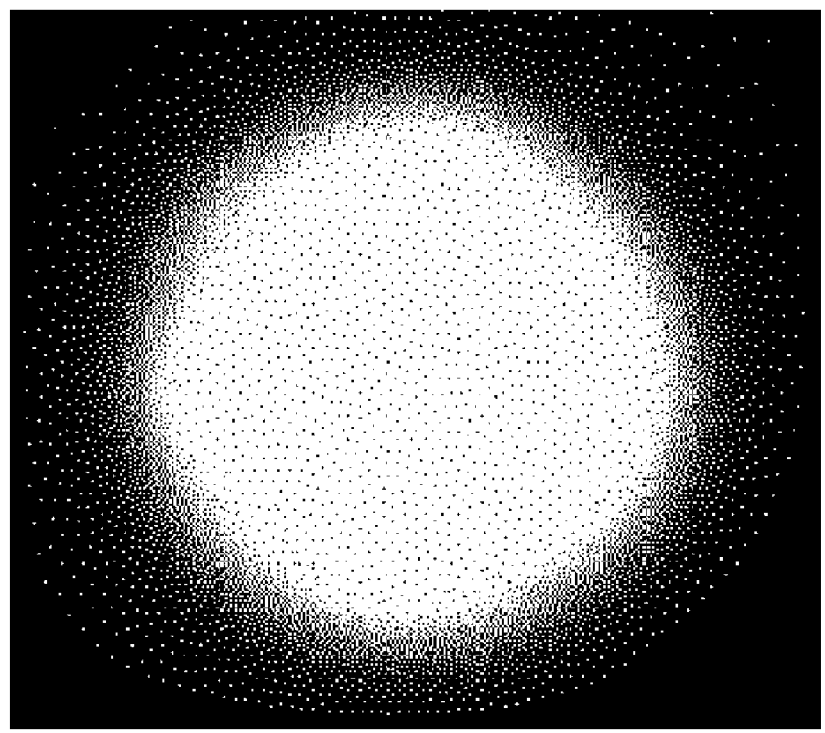
FIG. 6 is a diagram which shows an image of an EL according to the conventional technique.

When there is a system which can detect light emission spectrums, the existence of the ESD damage can be found. The system which detects the above-mentioned phenomenon is shown in FIG. 4. As shown in the figure, without complicated measurements, it is possible to detect the change of the light emission spectrum by using a known optical spectrum analyzer 50 as the detecting system. In particular, the light output from a communication module 10 provided with a VCSEL 20 is connected to the optical spectrum analyzer 50 by using an optical fiber 30. The optical spectrum analyzer 50 analyzes the light emission spectrum, and outputs an analysis result, as shown in FIG. 3. As a result of the analysis, when the peaks of the light emission spectrum are less than a predetermined number, it is determined that a damage due to ESD occurs in the VCSEL 20. The predetermined number used as a threshold value is set as a number smaller than the number of peaks measured beforehand. That is, the light emission spectrum of the output light of the VCSEL 20 used is obtained beforehand, and the number of the peaks is counted. When the number of peaks which is obtained by obtaining an output light of the VCSEL 20 to be inspected and obtaining the light emission spectrum of the output light is smaller than the number of peaks acquired previously, it is determined that there is a fault.

In the mounting processes of producing the communication module 10, it is very difficult to specify when in what process an ESD occurs and an damage is given to the VCSEL 20. Therefore, it is most effective to screen a damaged VCSEL 20 when the VCSEL 20 is a modularized product.

When the VCSEL 20 is modularized and screened based on electrical characteristics, such as IV (current/voltage) characteristic, the inside of the module is complicated. When the VCSEL 20 is screened based on IL (current/light output) characteristic, the light emission intensity of the VCSEL 20 itself cannot be measured because the coupling loss of the module exists in the modularized state.

However, according to the technique of detecting the number of the peaks of the light emission spectrum as mentioned above, the ESD damage of the VCSEL 20 can be detected just by measuring the light emission spectrum. Therefore, screening becomes possible through a very simple and inexpensive inspection. That is, the damaged VCSEL 20 can be detected by only measuring the light emission spectrum, without obtaining the current/light emission power characteristic, obtaining the current/voltage characteristics, and making EL measurements. Therefore, it is possible that the measurement can be made by one fault detection apparatus (for example, the optical spectrum analyzer 50) in a short time. Even if a VCSEL is an enclosed module, it is possible to make the measurement, and a very effective shipping inspection becomes possible.

The invention is explained based on the embodiment above. The embodiment is illustrative and it is understood by those skilled in the art that it is possible to make various modifications to those components and their combination and that these modifications are also in the scope of the invention.

For example, it is possible that a means that computes the number of peaks from the analysis result of the light emission spectrum is provided in the optical spectrum analyzer 50, and when the number becomes below a threshold value that a user sets, a warning that there is a fault may be given. More particularly, it is possible to use a function which simulates the publicly known peak detecting circuit using the operational amplifier (or comparator) of FET inputs. Since a fault due to ESD can also be supposed after the communication module 10 is shipped, the number of peaks can be used for fault diagnoses after the communication module 10 is installed by listing the number of peaks in an inspection result table at the time of shipping the communication module 10. It is also possible that a means that records a detection history is provided and the seriousness of the fault may be determined based on the change of the number of peaks. It is also possible that when the change of the number of peaks is greatly dependent on the number of active layers (MQW) and such a characteristic is known beforehand, the predetermined number that is set as a threshold value is dependent on the number of active layers.

Although the present invention is described in detail with reference to the embodiments, it is apparent that various modifications and amendments may be made by those skilled in the art without departing from the spirit and scope of the invention.

This application is based on the Japanese patent application (Patent Application No. 2009-251731) filed on Nov. 2, 2009, whose contents are incorporated herein by reference.

REFERENCE SIGNS LIST

10: communication module
20: VCSEL
30: optical fiber
50: optical spectrum analyzer

The invention claimed is:

1. A fault detection method for VCSEL, comprising:
a step of obtaining an output light of the VCSEL;
a step of specifying the number of peaks of light emission spectrum of the output light by analyzing the light emission spectrum; and
a step of determining that a fault has occurred in the VCSEL when the number of peaks is smaller than a predetermined number.

2. The fault detection method for VCSEL according to claim 1, wherein the predetermined number is a number that corresponds to a structure of an active layer of the VCSEL and reflectors which are formed above and below the active layer.

3. A fault detection apparatus for VCSEL configured to obtain an output light of a VCSEL as an object to be checked, to specify the number of peaks of light emission spectrum of the output light by analyzing the light emission spectrum, and to determine that a fault has occurred in the VCSEL when the number of peaks is smaller than a reference threshold which is the number of peaks of the VCSEL appeared when a fault has not occurred,
    wherein a sensor receives the output of light from the VCSEL, and an optical spectrum analyzer determines that the fault has occurred.

* * * * *